US009100070B2

(12) United States Patent
Pischl (10) Patent No.: US 9,100,070 B2
(45) Date of Patent: Aug. 4, 2015

(54) METHOD AND SYSTEM FOR MITIGATING TRANSFORMER SATURATION IN A COMMUNICATION INTERFACE

(71) Applicant: Broadcom Corporation, Irvine, CA (US)

(72) Inventor: Neven Pischl, Santa Clara, CA (US)

(73) Assignee: Broadco Corporation, Irvine, CA (US)

( * ) Notice: Subject to any disclaimer, the term of this patent is extended or adjusted under 35 U.S.C. 154(b) by 0 days.

(21) Appl. No.: 14/253,531

(22) Filed: Apr. 15, 2014

(65) Prior Publication Data

US 2014/0226753 A1 Aug. 14, 2014

Related U.S. Application Data

(63) Continuation of application No. 11/563,349, filed on Nov. 27, 2006, now abandoned.

(51) Int. Cl.
*G01R 31/08* (2006.01)
*H04B 1/04* (2006.01)
*G01R 27/06* (2006.01)
*H04L 25/02* (2006.01)

(52) U.S. Cl.
CPC .............. *H04B 1/0475* (2013.01); *G01R 27/06* (2013.01); *H04B 2001/0408* (2013.01); *H04L 25/0266* (2013.01); *H04L 25/0288* (2013.01)

(58) Field of Classification Search
CPC ...................................................... G01R 27/06
USPC ........................................................ 324/525
See application file for complete search history.

(56) References Cited

U.S. PATENT DOCUMENTS

| 4,078,157 | A * | 3/1978 | Lender et al. ................. 375/214 |
| 4,352,153 | A * | 9/1982 | Voyer .............................. 363/26 |
| 4,704,573 | A * | 11/1987 | Turner, Jr. ..................... 324/646 |
| 4,766,386 | A * | 8/1988 | Oliver et al. .................. 324/533 |
| 7,102,360 | B2 * | 9/2006 | Bougaud et al. .............. 324/525 |
| 7,230,970 | B1 * | 6/2007 | Bryant .......................... 375/130 |
| 7,724,831 | B2 * | 5/2010 | Fukahori et al. ............. 375/258 |
| 2004/0120259 | A1 * | 6/2004 | Jones et al. ................... 370/250 |
| 2005/0212526 | A1 | 9/2005 | Blades |
| 2006/0078093 | A1 * | 4/2006 | Karam et al. .................... 379/24 |
| 2006/0117089 | A1 * | 6/2006 | Karam .......................... 709/208 |
| 2006/0182269 | A1 * | 8/2006 | Lo et al. ................... 379/406.08 |
| 2006/0215339 | A1 * | 9/2006 | Camagna et al. ............... 361/90 |
| 2006/0218422 | A1 * | 9/2006 | Camagna et al. ............. 713/300 |
| 2007/0260904 | A1 * | 11/2007 | Camagna et al. ............. 713/310 |
| 2007/0280471 | A1 * | 12/2007 | Fallahi et al. ............. 379/399.01 |

OTHER PUBLICATIONS

Electrical Engineering Dictionary, ed. Phillip A. LaPlante, CRC Press, Boca Raton, FL, 2000, p. 342.

* cited by examiner

*Primary Examiner* — Benjamin M Baldridge
(74) *Attorney, Agent, or Firm* — Brinks Gilson & Lione (57) ABSTRACT

A method and system for mitigating transformer saturation in a communication interface is provided. The method may include detecting a change in impedance resulting from transformer saturation of at least one isolation transformer utilized in a network path of a network. The network may conform to an IEEE 802.3af specification where power may be delivered through the network. The method may further comprise generating a pulse at a one end of the network and measuring a reflection at that end to detect the transformer saturation. In response to the impedance change, a transmitter signal may be pre-distorted in order to compensate for the detected transformer saturation, or the power delivered over the network may be disabled.

18 Claims, 5 Drawing Sheets

METHOD AND SYSTEM FOR MITIGATING TRANSFORMER SATURATION IN A COMMUNICATION INTERFACE

PRIORITY CLAIM

This application claims priority to U.S. patent application Ser. No. 11/563,349, pending, filed Nov. 27, 2006, which is entirely incorporated herein by reference.

TECHNICAL FIELD

Certain embodiments of the invention relate to network communication systems. More specifically, certain embodiments of the invention relate to a method and system for detecting transformer saturation in a communication interface.

BACKGROUND

Computer networks are continually being enhanced to improve the ways in which people communicate. For example, the Internet has enabled people to gain access to vast amounts of information. Besides the Internet, networks are utilized to facilitate the transfer of files between computers as well as to connect computers to printers, scanners, cameras and a whole host of other devices. The physical characteristics of the network can take on many different characteristics. For example, the actual connections may be made through coax or twisted pair cables. Routers and hubs may be utilized to connect multiple computers to one another and to direct network traffic. The protocol utilized by the network may vary. For example, the protocol may be TCP/IP, IPX/SPX, or AppleTalk.

Although most often thought of as a means for computers to communicate with one another, networks are now being utilized for other forms of communications. For example, in a security system, security cameras may communicate to a server computer via an IP network rather than stream analog video information over a video cable. This may make it easier to add security systems where an IP network already exists. Furthermore, in a networking environment, the computer and camera could be a great distance apart whereas the distance may be much shorter if the analog video were transferred directly over a cable.

Some network systems allow for the transfer of power over the network cable, by coupling DC voltages and currents to the conductors. For example, one way to transfer power may be to utilize unused conductors in the network cable. Another method may be to transfer the power utilizing the same conductors, but superimposing the power by utilizing isolation transformers. The second method may conform to IEEE 802.3af. This method may work well for most situations. However, under certain conditions the characteristics of the transformers may change and thus impede the transfer of data.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY

A system and/or method is provided for detecting transformer saturation in a communication interface substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION

Certain embodiments of the invention may be found in a method and system for detecting transformer saturation in a communication interface. The method may include detecting a change in impedance resulting from transformer saturation of at least one isolation transformer utilized in a network path of a network. The network may conform to an IEEE 802.3af specification where power may be delivered through the network. The method may further comprise generating a pulse at a one end of the network and measuring a reflection at that end to detect the transformer saturation. In response to the impedance change, a transmitter signal may be pre-distorted in order to compensate for the detected transformer saturation, or the power delivered over the network may be disabled.

Figure 1:
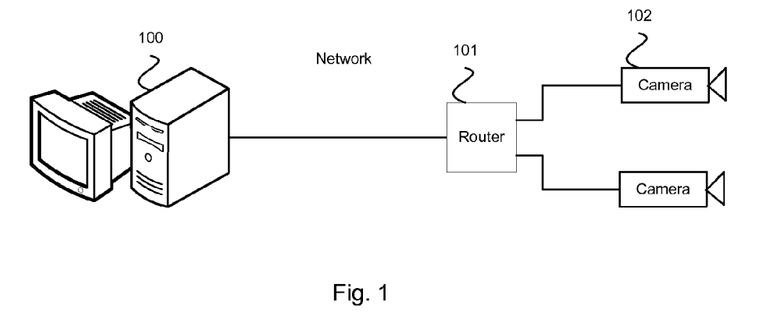
FIG. 1 is a block diagram of an exemplary arrangement for distributing power over an Ethernet connection, which may be utilized in connection with an embodiment of the invention.

FIG. 1 is a block diagram of an exemplary arrangement for distributing power over an Ethernet connection, which may be utilized in connection with an embodiment of the invention. Referring to FIG. 1, there is shown a computer 100, a router 101, and two cameras 102. The computer 100 may comprise suitable logic, circuitry, and/or code that may enable communicating data over a network connection. For example, the computer 100 may comprise a network card and the network card may communicate utilizing an Ethernet standard, such as IEEE 802.3a. The network card may comprise suitable logic, circuitry, and/or code that may enable sending power over the same Ethernet connection. For example, the Ethernet connection may conform to IEEE 802.af. In this regard, the physical network connection may comprise a category 5 cable. This cable may, for example, have a total of 8 conductors or 4 twisted pair conductors. Two of the twisted pair conductors may be utilized for data communication and the other two may be unused. In some embodiments the unused conductors may, for example, be utilized to transfer power. In this regard, an output voltage of the power supply may be 48 volts DC. In other embodiments, the power may be distributed over the data lines.

The router 101 may comprise suitable logic, circuitry, and/or code that may enable routing data between a plurality of devices. For example, the router 101 may route data packets from the computer 100 to various end devices, such as the cameras 102 shown in FIG. 1. In this regard, the connection between the computer 100 and the router 101 and the router 101 and the cameras may be an Ethernet connection as described above. To facilitate data transfers, the router 101 may require a power source. The router 101 may, for example, receive power from a power adapter plugged into a wall. The router 101 may also be capable of utilizing power transferred from the network card in the computer 100 and may be capable of outputting power for end devices, such as the cameras 102 shown in FIG. 1.

The cameras 102 may comprise suitable logic, circuitry, and/or code that may enable capturing images and transferring those images over an Ethernet connection. In this regard the cameras 102 may be coupled to the router 101. The cameras 102 may be capable of operating from power delivered over the Ethernet connection. In this regard, the cameras 102 may comprise additional logic, circuitry, and or code that may enable converting the power delivered over the Ethernet into voltages more suitable for powering each of the cameras 102 during operation.

Figure 2A:
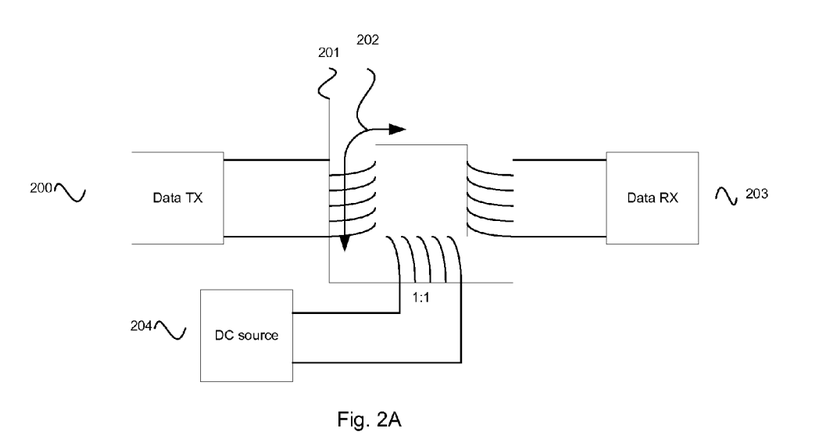
FIG. 2A is a block diagram of an exemplary circuit for communicating data via a transformer where the transformer is also utilized for power distribution, which may be utilized in connection with an embodiment of the invention.

FIG. 2A is a block diagram of an exemplary circuit for communicating data via a transformer where the transformer is also utilized for power distribution, which may be utilized in connection with an embodiment of the invention. Referring to FIG. 2A, there is shown a data TX 200, a transformer 201, a data RX 203, a magnetic flux (H) within the transformer core 202, and a DC source 204.

Figure 2B:
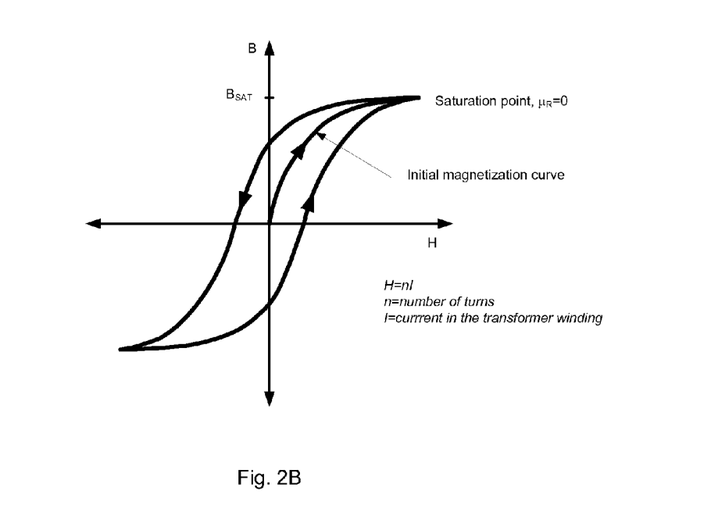
FIG. 2B is an exemplary graph of a hysteresis curve for a transformer, which may be utilized in connection with an embodiment of the invention.

FIG. 2B is an exemplary graph of a hysteresis curve for a transformer, which may be utilized in connection with an embodiment of the invention. The central area of the curve may correspond to the "linear region" of the transformer 201. H 202 may be proportional to the current in the transformer winding.

In operation, it may be necessary that the transformer 201 operate in the linear region. That is, it may be necessary that the signal-current operating point is around "zero" and that the maximum amplitude of the signal-current does not reach the area of saturation. When this is the case, the output signal on the secondary of the transformer 201 going to the data RX 203 may be linearly proportional to the TX signal from the data TX 200.

If the signal-current reaches into the saturation area, distortions may occur, and transmission may not work properly. This may, for example, happen when the signal current-amplitude is too large. That is, this could occur even without a DC bias from the DC source 204 when the signal amplitude is too large. This may also occur, when the operating point of the transformer 201 is moved toward or into the saturation area by applying a DC-current to the transformer winding from the DC source 204. A DC bias superimposed on one of the data-windings may also move the operating point of the transformer 201 toward saturation area, possible resulting in a distorted signal at the output of the transformer 201.

Figure 3:
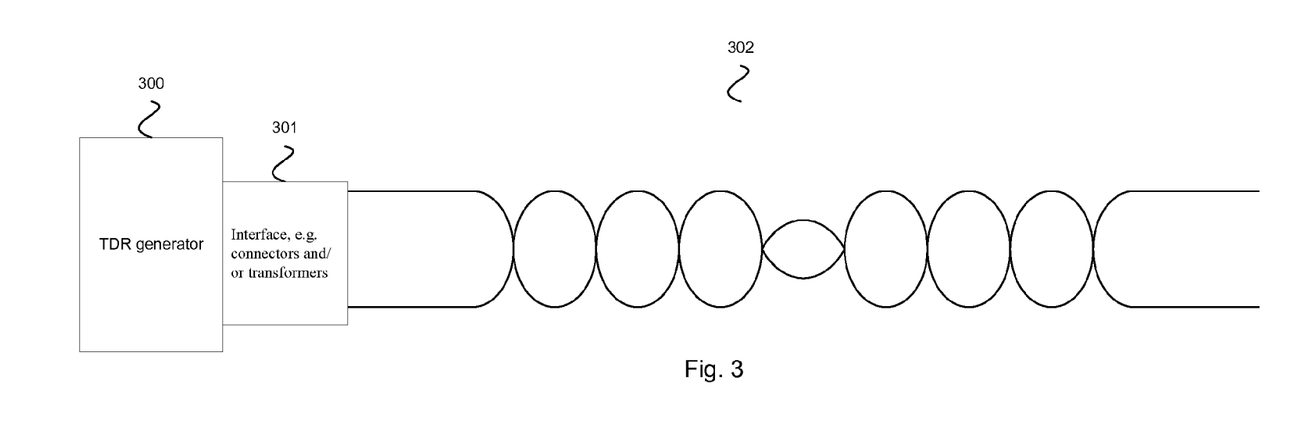
FIG. 3 is an exemplary system for detecting faults in a network cable, in connection with an embodiment of the invention.

FIG. 3 is an exemplary system for detecting faults in a network cable, in connection with an embodiment of the invention. Referring to FIG. 3, there is shown a TDR (time domain reflectometer) 300, a network cable 302, and an interface 301. The TDR 300 may work on the same principle as radar. A pulse of energy may be transmitted down a network cable 302. When that pulse reaches the end of the network cable 302, or a fault along the cable, part or all of the pulse energy may be reflected back to the TDR 300. The TDR 300 may measure the amount of time it takes for the signal to travel down the network cable 302, reflect off an impedance discontinuity, and reflect back. It may also compare the waveform of the launched pulse and the received reflection. The TDR 300 may then convert this time to distance, as well as the reflected waveform, and display the information as a location and magnitude and type of impedance (real, capacitive, inductive) discontinuity along the network cable 302.

A TDR 300 may measure a change in impedance, which may be caused by a variety of reasons. For example, the change in impedance may be related to network cable 302 damage, change in cable type, or improper installation. The change in impedance may also be the result of defective manufacturing. In this regard, the impedance of the cable may be determined by the spacing of the conductors from each other and the type of dielectric utilized. If the conductors are manufactured with exact spacing and the dielectric is, for example, exactly constant, the cable impedance may be constant. The cable impedance may vary along the line if, for example, the conductors are kinked, the spacing between the conductors is changed, or a component with improper impedance is connected anywhere along the line.

The TDR 300 may operate by sending electrical pulses down the cable and sampling the reflected energy. Any impedance change may cause some energy to reflect back toward the TDR 300 and may be displayed on the TDR 300. The characteristics of the reflected signal may be utilized to determine the amount of change in impedance.

Figure 4:
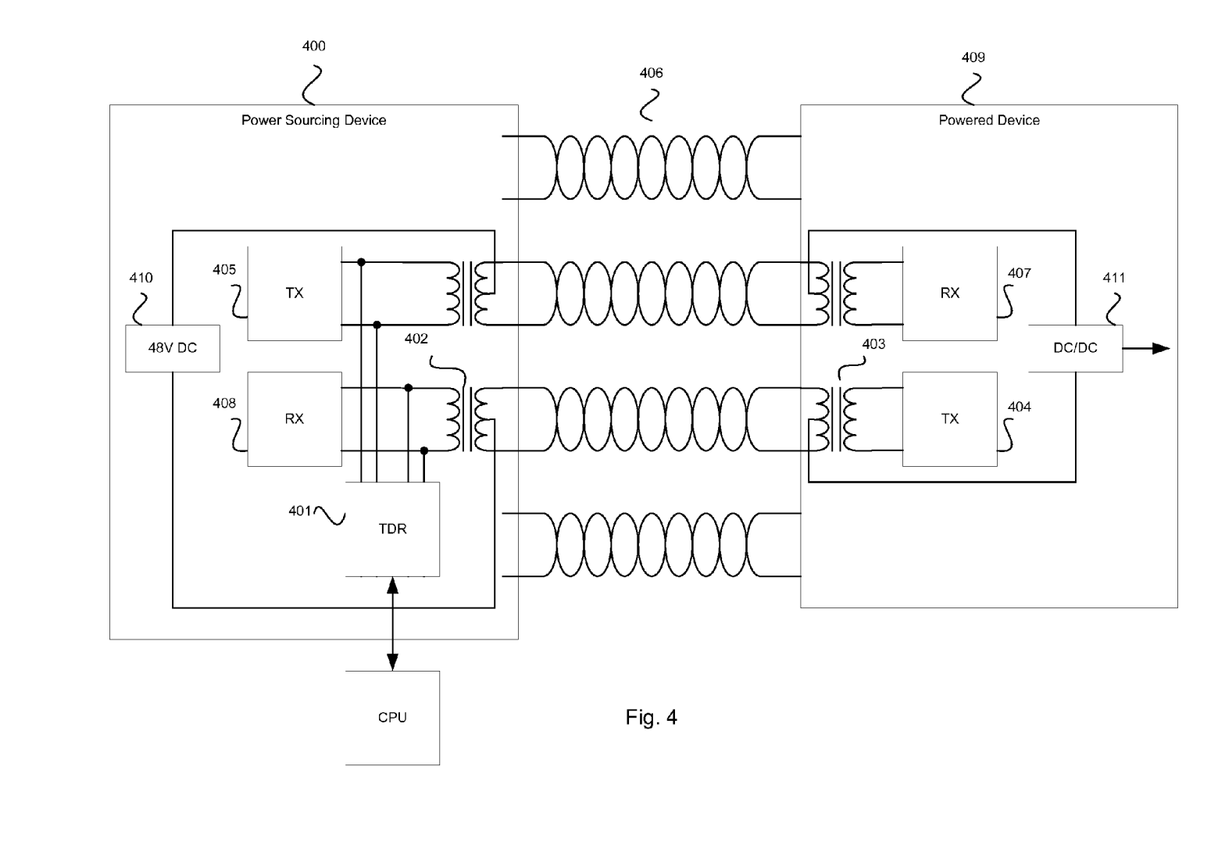
FIG. 4 is a block diagram of an exemplary arrangement for detecting transformer saturation in a communications interface, in accordance with an embodiment of the invention.

FIG. 4 is a block diagram of an exemplary arrangement for detecting transformer saturation in a communications interface, in accordance with an embodiment of the invention. Referring to FIG. 4, there is shown a power sourcing device (PSD) 400, a network cable 406, and a powered device (PD) 409. Referring to the PSD 400, there is shown a PSD transmitter 405, a PSD receiver 408, an isolation transformer 402, a power supply 410, and a TDR 401. Referring to the PD 409, there is shown a PD transmitter 404, a PD receiver 407, and a DC/DC converter 411.

The PSD 400 may comprise suitable logic, circuitry, and or code that may enable communication of data over an interface as well as delivering power over the same interface. For example, the PSD 400 may be a network interface card (NIC) in a computer 100 (FIG. 1). The PSD transmitter 405 may comprise suitable logic, circuitry, and/or code that may enable conversion of data to a suitable transmission format so that it may be transferred long distances. For example, a computer 100 may input data bits into the PSD transmitter 405 and the PSD transmitter 405 may output a differential voltage corresponding to the data bits. The PSD receiver 408 may comprise suitable logic, circuitry, and/or code that may enable converting data communicated from a remote transmitter back into a format suitable for a computer. The PSD transmitter 405 and PSD receiver 408 may be coupled to the PSD isolation transformers 402.

The PSD isolation transformers 402 and the PD isolation transformers 403 may comprise several windings and a core that may enable isolation of DC voltages that may be present on the primary and secondary. The isolation transformers 402 may have characteristics similar to the transformer shown in FIG. 2A. The windings of the isolation transformers 402 may be center tapped. In the PSD 400, the center taps may be coupled to the DC power supply 410. In the PD 409, the center taps may be coupled to the DC/DC converter 411. The other taps may be coupled to the network cable 406.

The network cable 406 may comprise several conductors that may enable communication of data as well as delivery of power. The network cable 406 may correspond to a category 5 cable. In this regard, the network cable 406 may comprise 4 sets of twisted pair cables. Two of the twisted pair cables may be utilized to communicate data between, for example, the PSD 400 and the PD 409. The same twisted pair cables may also be utilized to deliver power from the PSD 400 to the PD 409. The ends of the network cable 406 may be coupled to the isolation transformers 402 in the PSD 400 and the isolation transformers 403 in the PD 409.

The PD transmitter 404 may comprise suitable logic, circuitry, and/or code that may enable conversion of data to a suitable transmission format so that it may be transferred over long distances. For example, a computer may input data bits into the PD transmitter 404 and the PD transmitter 404 may output a differential voltage corresponding to the data bits. The PD receiver 407 may comprise suitable logic, circuitry, and/or code that may enable converting data communicated from a remote transmitter back into a format suitable for a computer. The PD transmitter 404 and PD receiver 407 may be coupled to the PSD isolation transformers 403.

The power supply 410 may comprise suitable logic, circuitry, and/or code that may enable the generation of power to power a remote device. In this regard, the power supply 410 may generate, for example, 48 volts. The power supply 410 may be coupled to the center taps on the secondaries of the PSD isolation transformers 402 in the PSD 400.

The DC/DC converter 411 may comprise suitable logic, circuitry, and/or code that may enable the conversion of voltage from one DC voltage to another DC voltage. In this regard, the DC/DC converter 411 may input 48 volts and may output a voltage sufficient to power the PD 409. For example, the output of the DC/DC converter 411 may be 5 volts or 12 volts. The output may also be greater than the input voltage. The DC/DC converter 411 may be coupled to the center taps on the secondaries of the PSD isolation transformers 403 in the PD 409.

The TDR 401 may comprise suitable logic, circuitry, and/or code that may enable the detection of faults in a communication path. In this regard, the TDR 401 may correspond to the TDR shown in FIG. 3. The TDR 401 may reside within the PSD 400 and may be coupled to the primary side of the PSD isolation transformers 402. The TDR may transmit a pulse through the PSD isolation transformers 402 and measure the reflections caused by changes in impedance between the PSD 400 and the PD 400. In this regard, the TDR may be capable of detecting changes in the impedance of the isolation transformers 402 and 403 as well as defects in the network cable 406 or whether or a component with improper impedance is connected anywhere along the line.

In operation, the power supply 410 in the PSD 400 may be utilized to supply power to a PD 409. The power may be transferred via the same twisted pair cables utilized for communication between the PSD 400 and the PD 409. The power may be superimposed on the communication signals by inserting the power into the center taps on the secondaries of the PSD isolation transformers 402. As a result, the signals traveling over the twisted pair may take on a DC bias equal to the power supply 410 voltage. This DC bias may be removed by PD isolation transformers 403.

In certain instances, DC current through the transformer may cause the transformer core to saturate by, for example, the mechanism shown FIG. 2A and FIG. 2B. This may happen even if the level of the DC current is within the operating specification for the PSD 400 and PD 409. It may depend on the transformer, contact resistance of the connector utilized and resistance of the conductors in the cable.

The TDR 401 may be utilized to detect when the transformer impedance changes. For example, it may be utilized to detect relative changes in the impedance of the isolation transformers 402 and 403 before and after a DC current has been applied. For example, the TDR 401 may detect if the DC current is saturating the core and thus causing an impedance drop, which may have a negative impact on the quality and possibility of data transmission through the isolation transformers 402 and 403. It may do this by generating pulses on either the PSD 400 or PD 409 side of the isolation transformers 402 and 403 and then measure the reflection off the isolation transformers 402 and 403. If saturation is detected then, for example, a CPU may reduce or eliminate the current delivered to PD or flag an error and/or warning signal that the data transmission may be affected.

In another embodiment of the invention, the signal may be intentionally pre-distorted when, for example, saturation is detected. For example, the PSD transmitter 405 may pre-distort the output signals so that when they pass through the saturating isolation transformers, the signals appear proper at the receiving end. The PSD transmitter 405 may also be capable of pre-distorting the signal in proportion to an amount of detected saturation.

In yet another embodiment of the invention, a TDR 401 may reside within the PD 409 and be coupled to the primary side of the isolation transformers 403. This may enable the PD 409 to detect transformer saturation as well.

Figure 5:
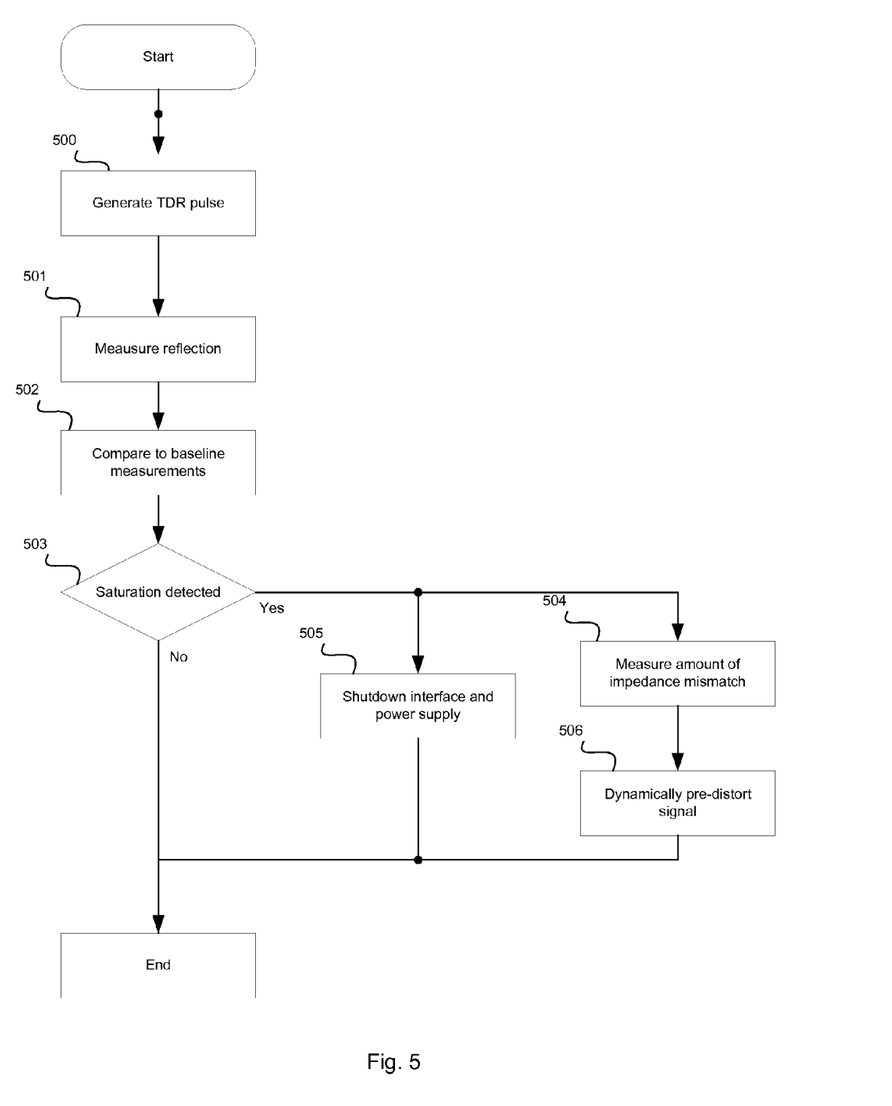
FIG. 5 is a block diagram of an exemplary flow diagram for detecting transformer saturation, in accordance with an embodiment of the invention.

FIG. 5 is a block diagram of an exemplary flow diagram for detecting transformer saturation, in accordance with an embodiment of the invention. Referring to FIGS. 4 and 5, at step 500, the TDR 401 may generate a pulse so that reflections may be measured. The optimal pulse characteristics may depend on the characteristics of the isolation transformers 402 and 403, the location of the transformer relative to the transceiver and on the characteristics of the interconnects used for the signal transmission, which may include PCB traces and other cables that may be utilized. At step 501, the TDR 401 may measure the reflections and at step 502, the TDR 401 may compare the measurements to baseline measurements. For example, during initial setup, the TDR 401 may have measured the impedance of the connection between the PSD 400 and the PD 409. This measurement may take into account the impedance of the isolation transformers 402 and 403 as well as the impedance of the network cable 406. The TDR 401 may store this information so that it may be utilized as a baseline measurement for later measurements.

At step 503, the TDR 401 may check if the connection between the PSD 400 and PD 409 matches the base line impedance. If the values don't match, then one or more of the isolation transformers 402 and 403 may be in saturation. The result of the comparison may be communicated to a CPU so that the CPU may take appropriate action.

If saturation has been detected then, at step 505 the CPU may shutdown communication and disable the power supply 410. The CPU may also report an error to the user so that the user may take care of the problem. In another embodiment of the invention, if saturation has been detected, then at step 504 the amount of the impedance mismatch may be determined. Then at step 506, this amount of mismatch may be utilized to dynamically pre-distort the signals. The pre-distortion may take place within the PSD transmitter 405. In this manner PSD 400 may compensate for the saturation.

Another embodiment of the invention may provide a method for performing the steps as described herein for detecting transformer saturation in a communication interface. For example, a change in the impedance of an isolation transformer 402 utilized in a network, resulting from transformer saturation may be detected by generating a pulse at one end of the network and measuring the reflection that corresponds to the isolation transformer 402. The network may conform to an IEEE 802.3af specification where power may be delivered through the network be DC power supply 410. In response to the impedance change, a transmitter signal may be pre-distorted by a transmitter 405 in order to compensate for the detected transformer saturation, or the power delivered over the network may be disabled.

Accordingly, the present invention may be realized in hardware, software, or a combination of hardware and software. The present invention may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A network interface card comprising:
    a power supply configured to produce a direct current (DC) power signal;
    a data transmission circuit that receives digital data for transmission over a network cable to a remote location, the data transmission circuit operating to convert the received digital data to a differential voltage;
    an isolation transformer having a primary winding coupled with the data transmission circuit to receive the differential voltage, a center tap coupled to the power supply to receive the DC power signal, and a secondary winding configured for coupling to the network cable to provide a composite signal to the network cable, the composite signal being a superposition of the DC power signal for powering a device through the network cable and the differential voltage for communicating information to a receiver on the network cable, the isolation transformer having a variable impedance which varies with the DC power signal in the isolation transformer; and
    a circuit coupled with the data transmission circuit and the isolation transformer and that detects variations in the variable impedance of the isolation transformer, wherein the circuit comprises a time domain reflectometer configured to cause the isolation transformer to discontinue the composite signal if the time domain reflectometer detects a reduction in the variable impedance of the isolation transformer.

2. The network interface card of claim 1 wherein the time domain reflectometer is coupled with the network cable and configured to provide electrical pulses to the network cable and sample reflected energy on the network cable due to the provided electrical pulses, and wherein the reflectometer is further configured to use the sampled reflected energy to determine an amount of change in the variable impedance of the isolation transformer.

3. The network interface card of claim 1 wherein the circuit is configured to detect relative changes in the variable impedance of the isolation transformer before a DC current from the power supply is applied to the isolation transformer and after the DC current from the power supply is applied to the isolation transformer and to interrupt the composite signal in response to a reduction in the variable impedance of the isolation transformer.

4. The network interface card of claim 1 wherein the circuit is configured to measure reflections on the network cable due to generated electrical pulses and to compared the measured reflections with a baseline measurement to determine variations in the variable impedance of the isolation transformer and to interrupt the composite signal in response to a reduction in the variable impedance of the isolation transformer.

5. The network interface card of claim 1 wherein the circuit is operable to detect a reduction in the variable impedance of the isolation transformer due to saturation of the isolation transformer sufficient to cause distortion of the differential voltage.

6. The network interface card of claim 1 further comprising a processor in communication with the isolation transformer and the data transmission circuit and configured to determine an amount of impedance mismatch between a current value of the variable impedance of the isolation transformer and a stored baseline value of the variable impedance of the isolation transformer.

7. The network interface card of claim 6 wherein the processor is further responsive to the determined amount of impedance mismatch to cause the data transmission circuit to dynamically pre-distort the differential voltage to compensate for distortion due to the impedance mismatch.

8. The network interface card of claim 1 wherein the DC power signal comprises a variable DC current and wherein the variable impedance of the isolation transformer varies in response to variation of the variable DC current in the isolation transformer to cause saturation of the isolation transformer at at least some values of the variable DC current.

9. A system comprising:
    a data transmission circuit that receives digital data for transmission and that produces a communication signal based on the digital data;
    an isolation transformer coupled with the data transmission circuit and configured for connection to a network cable and to a direct current (DC) power supply to communicate to the network cable a composite signal including a DC power signal combined with the communication signal; and
    a circuit coupled to the data transmission circuit and the isolation transformer that detects variations in the impedance of the isolation transformer, thereby detecting a saturation condition of the isolation transformer sufficient to cause distortion of the composite signal affecting reliable communication of the composite signal on the network cable.

10. The system of claim 9 wherein the circuit is operable to determine a current value of impedance of the isolation transformer and to compare the current value of the impedance of the isolation transformer with a stored baseline value of the impedance of the transformer and to identify a saturation condition of the isolation transformer based on the comparison.

11. The system of claim 10 wherein the data transmission circuit is operable to pre-distort the communication signal to compensate for distortion by the isolation transformer in the saturation condition.

12. The system of claim 11 wherein the data transmission circuit is operable to pre-distort the communication signal so that the composite signal appears un-distorted upon reception over the network cable despite distortion introduced by the isolation transformer in the saturation condition.

13. A method comprising:
receiving digital data for communication to a remote receiver over a network cable;
producing a differential voltage representative of the received digital data;
receiving a direct current (DC) power signal for powering a remote device over the network cable;
combining the differential voltage and the DC power signal in an isolation transformer to produce a composite signal;
detecting a saturation condition of the isolation transformer sufficient to affect reliable reception of the differential voltage; and
compensating for the detected saturation condition by pre-distorting the differential voltage.

14. The method of claim 13 wherein compensating for the detected saturation condition comprises suspending further production of the composite signal.

15. The method of claim 13 wherein compensating for the detected saturation condition comprises pre-distorting the differential voltage so that the composite signal appears un-distorted upon reception at the remote receiver over the network cable.

16. The method of claim 13 further comprising:
detecting relative changes in impedance of the isolation transformer; and
when a decrease in impedance of the isolation transformer is detected, identifying the saturation condition of the isolation transformer.

17. The method of claim 16 further comprising:
determining a current impedance of the isolation transformer;
retrieving a baseline impedance of the isolation transformer; and
comparing the current impedance of the isolation transformer with the baseline impedance of the transformer to detect the relative changes in the impedance of the isolation transformer.

18. The method of claim 13 further comprising:
coupling the remote receiver and the remote device to the network cable and coupling the network cable to the isolation transformer;
providing electrical test signals to the network cable to measure baseline values of impedance;
storing the baseline values of impedance;
subsequently, while receiving the DC power signal, providing operational electrical test signals to the network cable to measure current values of the impedance;
comparing the current values of the impedance with the stored baseline values; and
when a decrease in impedance of the isolation transformer is detected, identifying the saturation condition of the isolation transformer.

* * * * *